United States Patent [19]
Lee

[11] Patent Number: 5,672,527
[45] Date of Patent: Sep. 30, 1997

[54] METHOD FOR FABRICATING AN ELECTROSTATIC DISCHARGE PROTECTION CIRCUIT

[75] Inventor: Jiann-Shin Lee, Taichung Hsien, Taiwan

[73] Assignee: United Microelectronics Corp., Hsinchu, Taiwan

[21] Appl. No.: 613,091

[22] Filed: Mar. 8, 1996

[51] Int. Cl.$^6$ ............................................ H01L 21/336
[52] U.S. Cl. ............................ 437/41 RLD; 437/44; 437/56; 437/58; 257/356
[58] Field of Search ........................ 437/41 RLD, 44, 437/56, 57, 192, 200, 34, 58; 257/357, 355, 356

[56] References Cited

U.S. PATENT DOCUMENTS

| | | | |
|---|---|---|---|
| 4,717,684 | 1/1988 | Katto et al. | 437/200 |
| 5,246,872 | 9/1993 | Mortensen | 437/44 |
| 5,262,344 | 11/1993 | Mistry | 437/200 |
| 5,455,444 | 10/1995 | Hsue | 437/49 |
| 5,516,717 | 5/1996 | Hsu | 437/192 |
| 5,517,049 | 5/1996 | Huang | 257/357 |
| 5,529,941 | 6/1996 | Huang | 437/34 |
| 5,532,178 | 7/1996 | Liaw et al. | 437/44 |

*Primary Examiner*—Mary Wilczewski
*Attorney, Agent, or Firm*—Ladas & Parry

[57] ABSTRACT

A process for fabricating ESD protection circuit has been developed, in which decreased cycle time has been achieved via a reduction in photomasking steps. The present invention process features the use of only one photo mask to form ESD protection circuit without the saliside and the LDD structure. The method of present invention needs only one mask instead of several masks as in a conventional process to create the ESD protection circuit during the salicide process of the MOSFET.

10 Claims, 7 Drawing Sheets

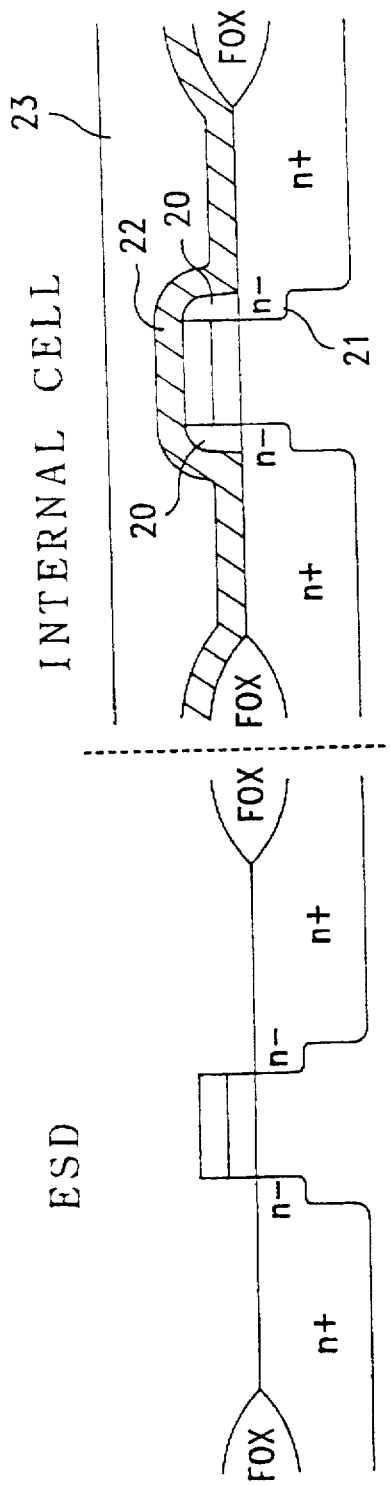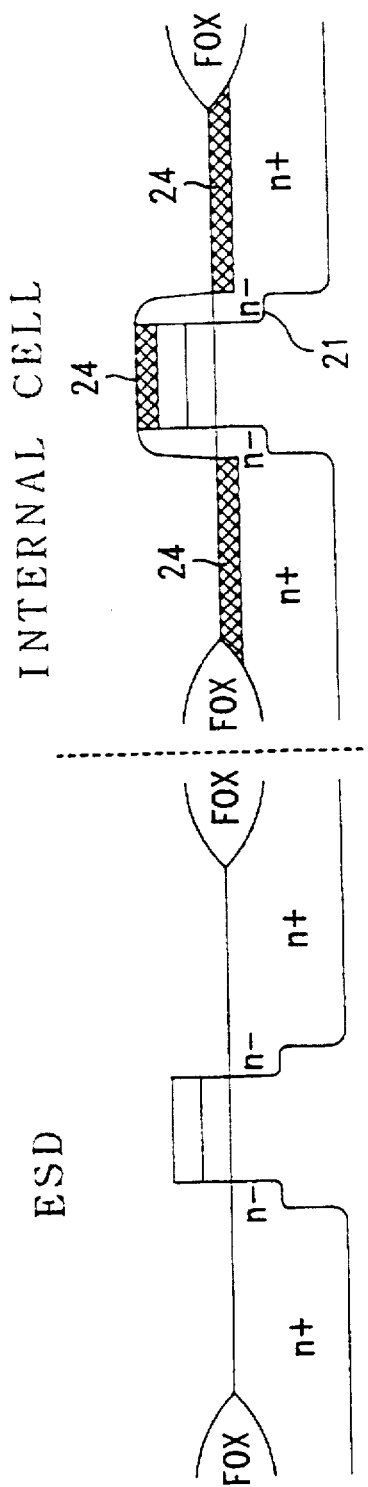
FIG. 2D
FIG. 2E

METHOD FOR FABRICATING AN ELECTROSTATIC DISCHARGE PROTECTION CIRCUIT

FIELD OF THE INVENTION

The present invention relates to a method of forming a electrostatic discharge (ESD) protection circuit during the salicide process of a MOSFET device, and, in particular, to a method of forming an ESD protection circuit without a lightly doped drain (LDD) structure and salicide.

BACKGROUND OF THE INVENTION

In order to achieve high circuit performance, MOSFET devices in silicon integrated circuit technology are scaled down to submicrometer range. Due to short channel length and high supply voltage the electric field strength within the device increases. As a result, MOSFET devices are susceptible to channel hot electron. To alleviate the high electric field at the reduced MOSFET channel length, lightly doped drain (LDD) devices have been proposed and the salicide process has been practiced to reduce the resistance of the devices. Unfortunately, the salicide and the LDD structure will reduce the capacity of the electrostatic discharge (ESD) protection circuit.

To fabricate the ESD protection circuit which does not have the salicide and LDD structure during the metal salicide process of MOSFET devices is performed, the conventional method is described as follows:

As shown in FIG. 1A, n⁻ regions are formed by using an ion implantation. Therefore, the LDD structure of the MOSFET devices is formed, wherein the density of the impurities is 1E13 atoms/cm², and the energy required is 60 KeV.

Next, a photo-resist 10 is used to mask the region of the internal device region. As illustrated in FIG. 1B n⁺ regions in the ESD protection circuit are formed by using implanting impurities, and the density of the impurities is 1E15 atoms/cm² while its energy is 80 KeV. The photo-resist is then removed.

FIG. 1C shows the resulting after using APCVD to deposit a silicon dioxide layer. Then a dry etching is used to etch the silicon dioxide layer to form the gate sidewall spacer 11. Then a second photo-resist 12 is formed on the ESD protection circuit. An ion implantation is used to form n⁺ regions and to form the LDD structure 13 as shown in FIG. 1D. Under this condition the density of the impurities is 4E15 atoms/cm² and the energy is 80 KeV. Then the second photoresist 12 is removed.

As can be seen from FIG. 1E, the titanium (Ti) metal layer 14 is deposited over the surface of the wafer. Thereafter the unmask Ti metal layer is etched by etchant which contains mixed H₂O₂ and NH₄OH at a ratio of 1:1. A third photo-resist 15 is deposited as show in FIG. 1F. The next step in the process is to perform a rapid thermal process, so that the Ti metal layer will react with the polysilicon to form salicide 16, and residual of the metal layer is selectively etched to form gate, source, and drain electrode metal salicide contact faces, with the metal to reduce the resistivity as shown in FIG. 1G.

SUMMARY OF THE INVENTION

It is therefore an object of the present invention to form an electrostatic discharge protection circuit.

It is another object of this invention to reduce the number of photomasking steps used to produce the electrostatic discharge (ESD) protection circuit.

It is yet another object of this invention to use a single mask to create the ESD protection circuit.

It is still yet another object of this invention to fabricate the ESD protection circuit without the salicide and lightly doped drain (LDD) structure.

The object of the present invention is fulfilled by providing a method for fabricating an ESD protection circuit on a semiconductor substrate which has defined source, drain, gate and field oxide. The method comprises the following steps of: depositing a metal layer in order to form salicide; coating and defining a photo-resist mask; etching the metal layer and gate sidewall spacer; removing the photo-resist; performing a rapid theormal process (RTP) so that the metal layer will react with the polysilicon layer to form polysilicon/metal i.e. salicide; residual of the metal layer is selectively etched to form gate, source, and drain electrode metal salicide contact faces. Then an implantation step is performed.

While conventional salicide process of the MOSFET needs several masks during the process, the present invention needs only one mask instead of several masks to create the ESD protection circuit during the salicide process of the MOSFET. Moreover this invention provides a method to remove the metal layer on the ESD protection circuit and to implant ion impurities to remove the LDD structure in one step.

BRIEF DESCRIPTION OF THE DRAWING

FIG. 2A to FIG. 2F are the cross-section views of the present invention to fabricate the electrostatic discharge protection circuie.

DETAILED DESCRIPTION OF THE PREFERRED EMBODIMENT

An embodiment of the present invention is applied to a semiconductor substrate to fabricate an electrostatic discharge (ESD) protection circuit without salicide and lightly doped drain (LDD) structure during metal salicide process of the MOSFET. This inventions provides a method to remove the metal layer on the ESD protection circuit and to remove the LDD structure by implanting impurities in one step. Both the metal layer on the ESD protection circuit and the LDD structure will reduce the capacity of ESD protection circuit. The LDD structure in ESD protection circuit, will be removed by implanting impurities. Moreover, the conventional salicide process needs several masks while present invention needs only one mask instead of several masks in the same salicide process. As illustrated in FIG. 2A to FIG. 2F.

Figure 1A:
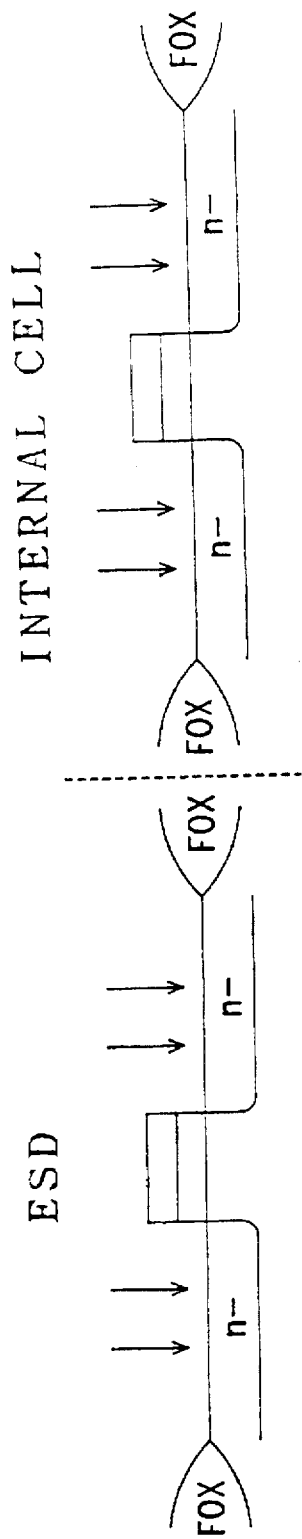
FIG. 1A to FIG. 1G are the cross-section views of the conventional method to fabricate the electrostatic discharge protection circuit.
Figure 1B:
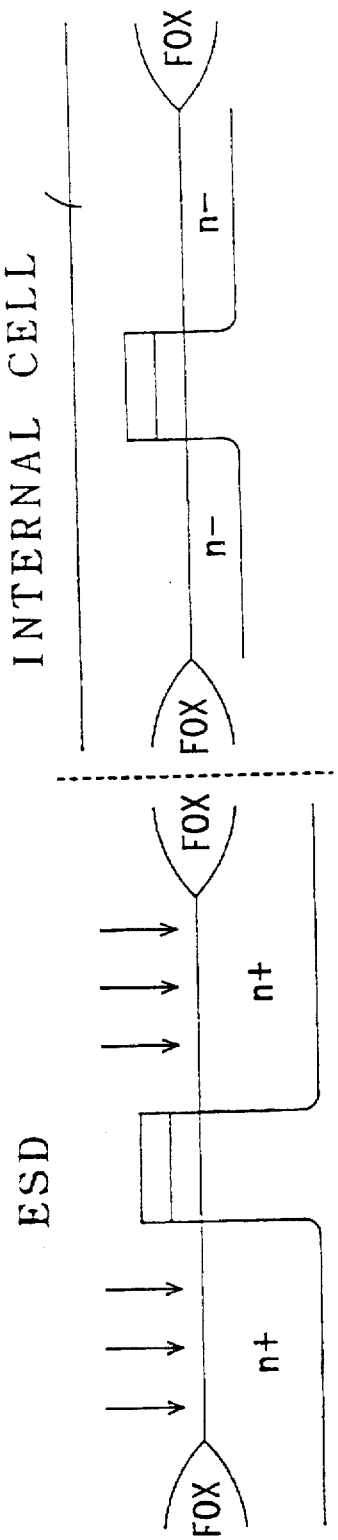
Figure 1C:
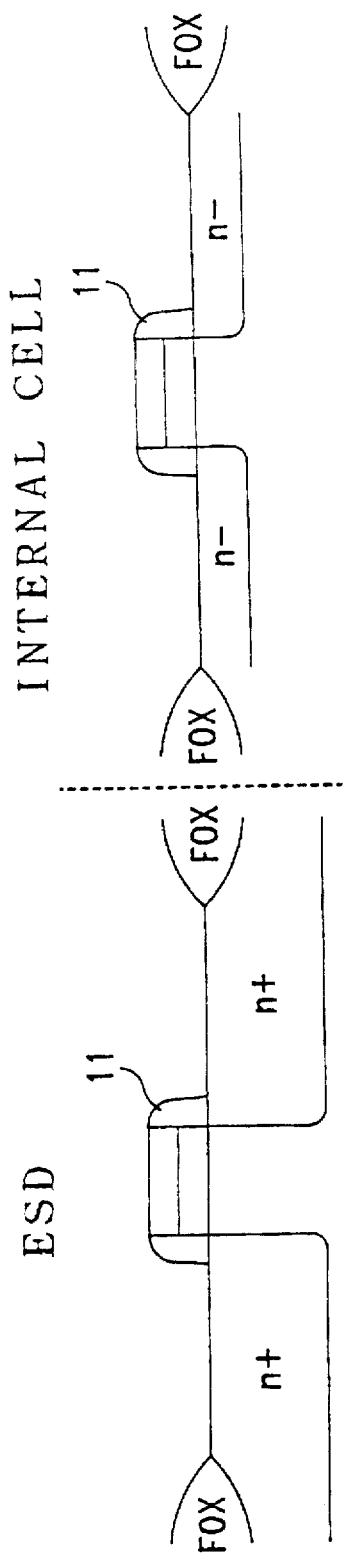
Figure 1D:
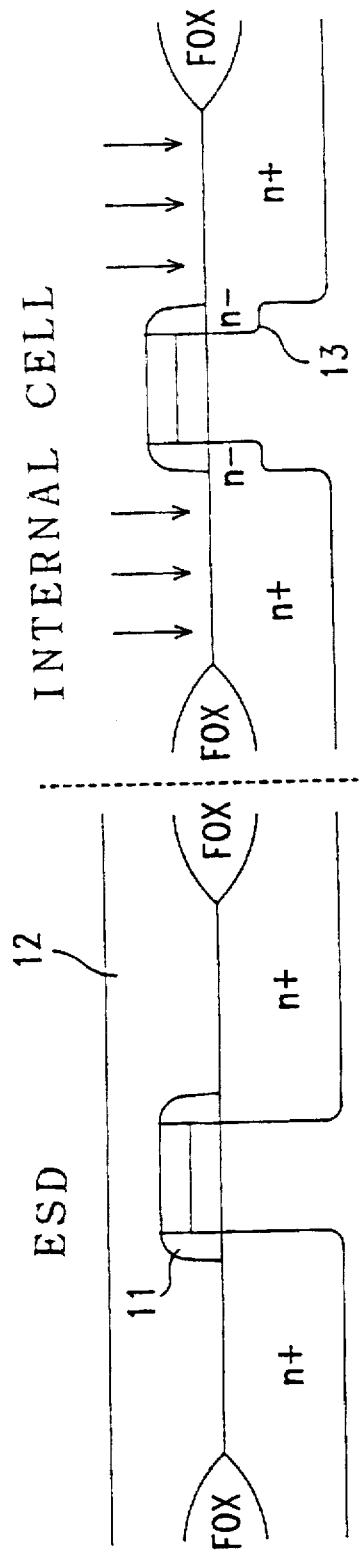
Figure 1E:
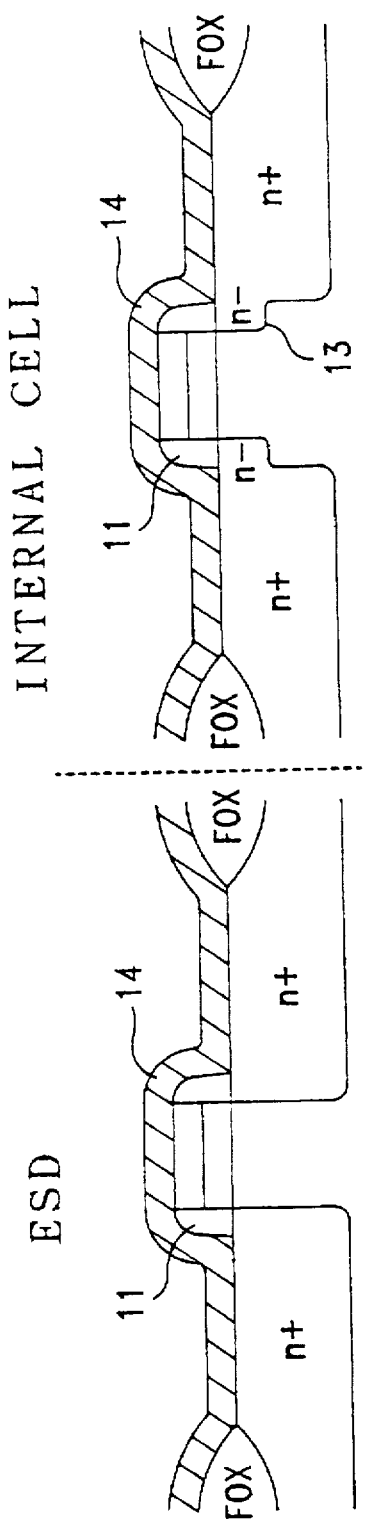
Figure 1F:
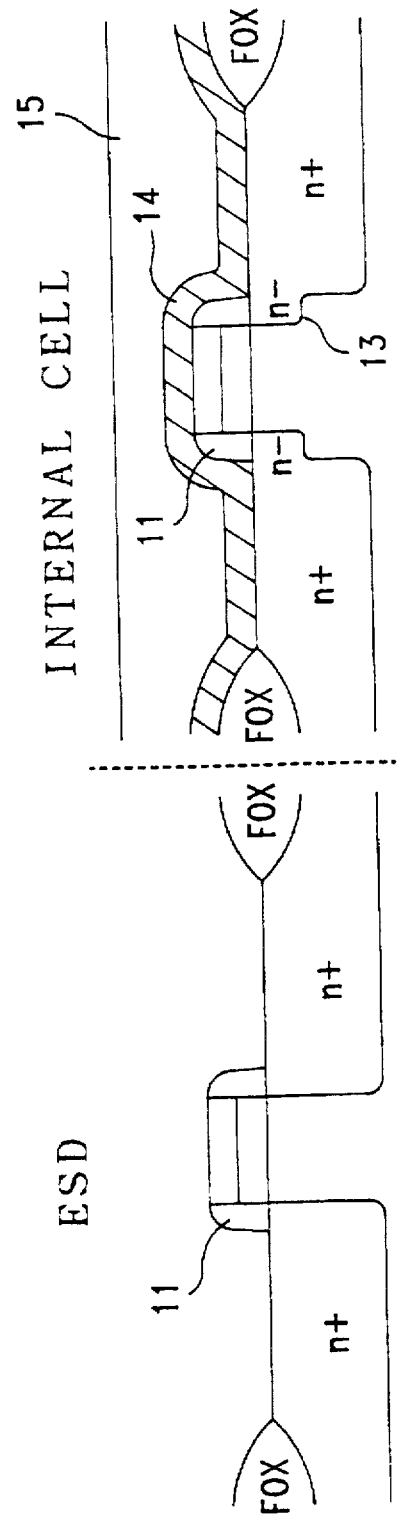
Figure 1G:
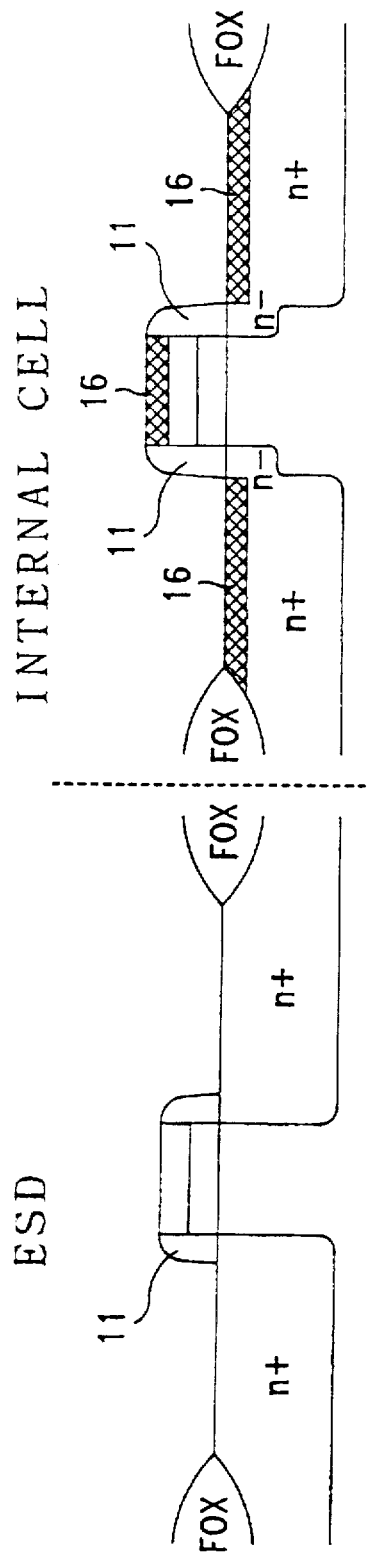
Figure 2A:
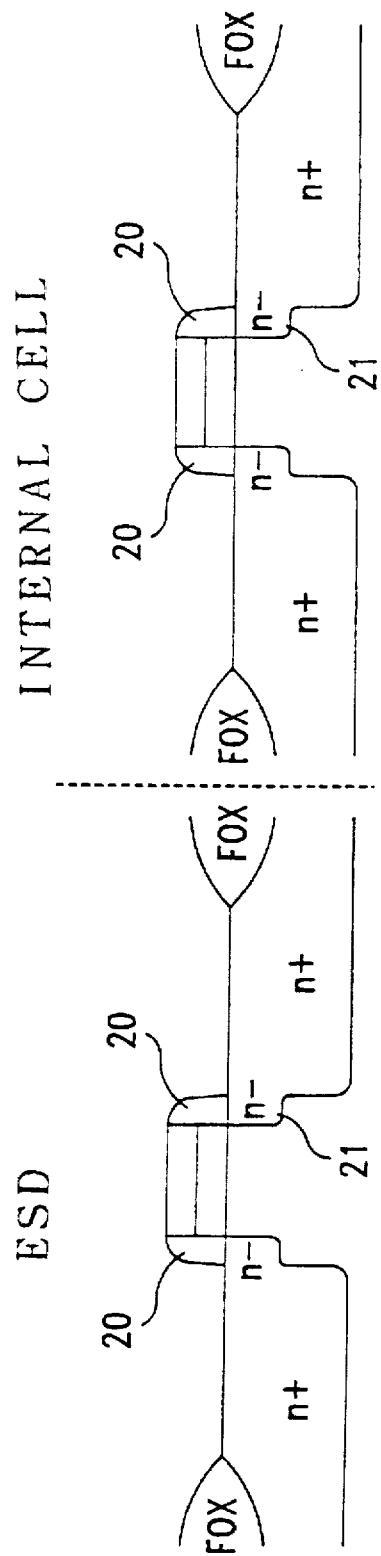

Referring now to the drawings, FIG. 2A depicts a silicon wafer which has defined field oxide, heavily-doped source and drain, gate, and side wall spacers 20 adjacent to the gate in the MOSFET device region and in the ESD protection circuit and the LDD structure 21.

Figure 2B:
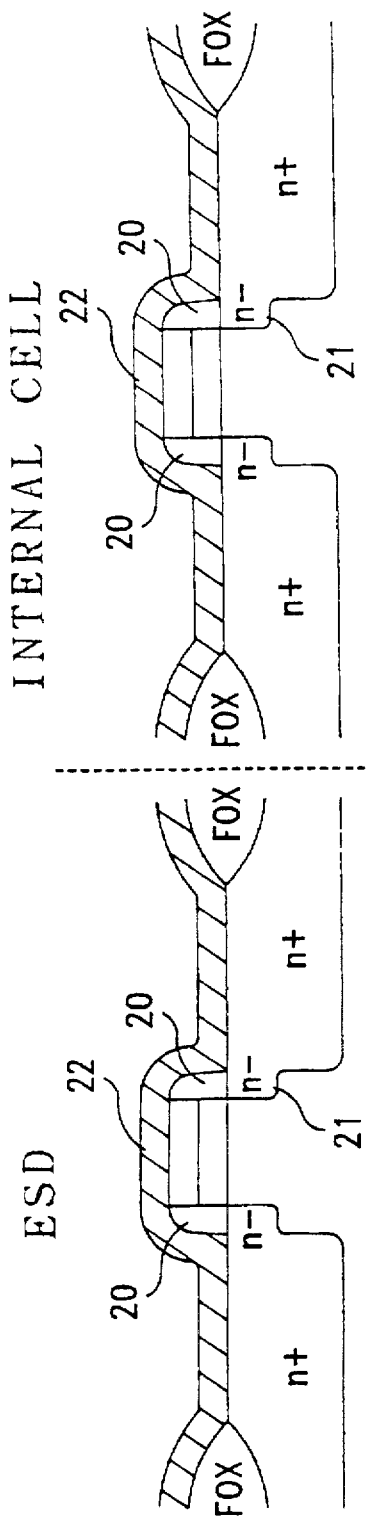
Figure 2C:
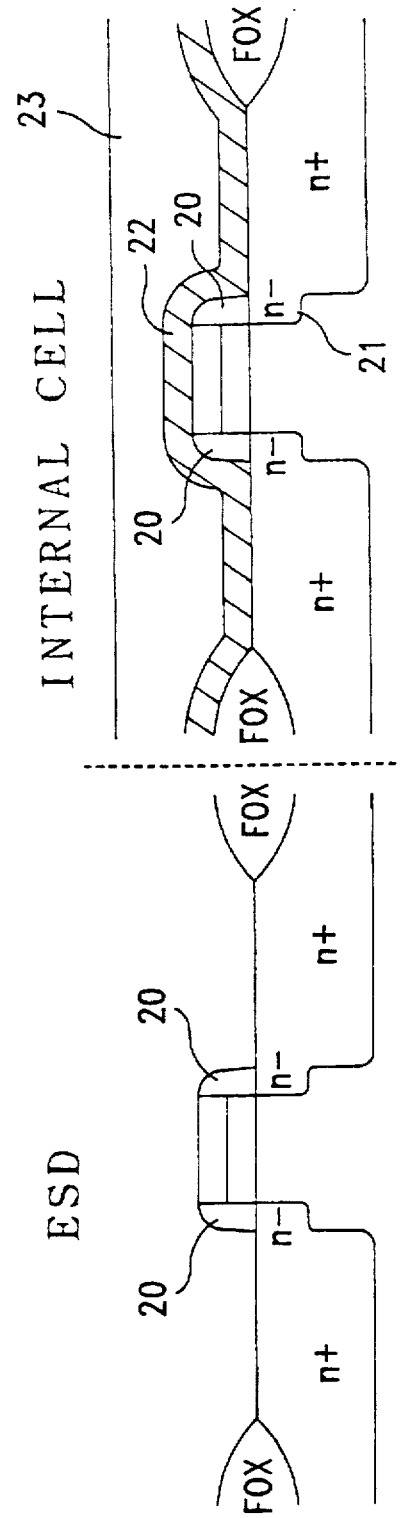

FIG. 2B shows a titanium (Ti) metal layer 22 (the metal layer could also be platinum, nickle or tungsten) which is deposited on the wafer, the thinkness of the Ti metal layer is 1500–2500 angstrom. A standard photo-resist 23 is utilized to mask the internal device region. The next step is to remove the Ti metal that is uncovered by the photo resist. The Ti metal layer is etched by using an etchant which contains H₂O₂ and NH₄OH mixed at a ratio of 1:1, a photo-resist 23 is patterned on the as show in FIG. 2C.

The next step is to remove the sidewall spacers, FIG. 2D shows the result after the dry etching to remove the sidewall spacers. The photo-resist 23 is then removed. After that a rapid theormal process (RTP) is performed so that the metal layer will react with the polysilicon layer to form polisilicon/metal i.e. salicide 24. The residual of the metal layer is selectively etched to form gate, source, drain electrode metal salicide contact faces, as show in FIG. 2E.

Figure 2F:
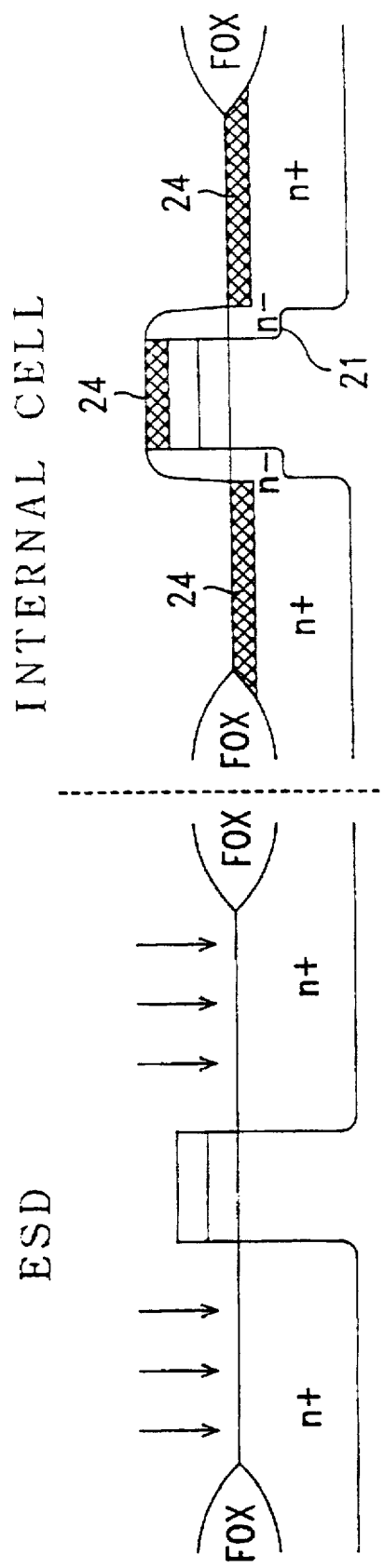

As shown in FIG. 2F, the LDD structure in the ESD protection circuit is removed by implanting impurities in the ESD protection circuit region. The density of the impurities is 1E15–1E16 atoms/cm$^2$ and energy is 80 Kev.

As stated above, in the present invention an ESD protection circuit is formed when the MOSFET forms polysilicon/metal compound i.e. salicide is formed to become metal contacts. While the conventional salicide process needs several masks during the process, the method of present invention needs only one mask instead of several masks in the salicide process. Moreover, this invention provides a method to remove the Ti metal layer on the ESD protection circuit, and the LDD structure in the ESD protection is removed in one step. It not only can improve the performance of ESD but also can reduce the cost of the manufacturing process. The process of the present invention for fabricating ESD protection circuit has been developed, in which decreased cycle time has been achieved via a reduction in photomasking steps. It should be noted that the present invention can be applied to either p type or n type substrate.

As is understood by a person skilled in the art, the foregoing preferred embodiment of the present invention is illustrative of the present invention rather than limiting the present invention. It is intended to cover various modifications and similar arrangements included within the spirit and scope of the appended claims, the scope of which should be accorded the broadest interpretation so as to encompass all such modifications and similar structure.

What is claimed is:

1. A method for fabricating an electrostatic discharge (ESD) protection circuit on a silicon substrate that has defined gate, lightly-doped source and drain, heavily-doped source and drain, field oxide and sidewall spacers adjacent said gate in a MOSFET device region and in an electrostatic (ESD) protection circuit region, said method comprising the steps of:

forming a metal layer on said silicon substrate;

coating and defining a photo-resist mask on said metal layer in said MOSFET device region;

etching unmasked portion of said metal layer to remove said metal layer in said ESD protection circuit region of said silicon substrate;

removing said sidewall spacers adjacent said gate in said ESD protection circuit of said silicon substrate;

stripping said photo-resist mask;

using a rapid thermal process to form salicide; and removing said lightly-doped drain (LDD) in said ESD protection circuit region by implanting impurities in the ESD protection circuit region.

2. The method for fabricating the electrostatic discharge (ESD) protection circuit as claimed in claim 1, wherein said metal layer is titanium, platinum, nickel, or tungsten metal.

3. The method for fabricating the electrostatic discharge (ESD) protection circuit as claimed in claim 2, wherein the thickness of said metal layer is 1500–2500 angstroms.

4. The method for fabricating the electrostatic discharge (ESD) protection circuit as claimed in claim 1, wherein said photoresist mask masks only said MOSFET device region, and unmasks said electrostatic discharge ESD protection circuit region.

5. The method for fabricating the electrostatic discharge (ESD) protection circuit as claimed in claim 1, wherein said unmasked portion of said metal layer is removed by using wet etching.

6. The method for fabricating the electrostatic discharge (ESD) protection circuit as claimed in claim 5, wherein the etchant of said wet etching contains $H_2O_2$ and $NH_4OH$ mixed at a ratio of 1:1.

7. The method for fabricating the electrostatic discharge (ESD) protection circuit as claimed in claim 1, wherein said sidewall spacers in said ESD protection circuit region are removed by dry etching.

8. The method for fabricating the electrostatic discharge (ESD) protection circuit as claimed in claim 1, wherein the density of said implanted impurities is 1E15–1E16 atoms/cm$^2$, and the energy of said implanted impurities is 80 KeV.

9. The method for fabricating the electrostatic discharge (ESD) protection circuit as claimed in claim 1, wherein said silicon substrate is n type or p type.

10. The method for fabricating the electrostatic discharge (ESD) protection circuit as claimed in claim 1, wherein said implanted impurities are n type or p type.

* * * * *